(12) United States Patent
Mertz et al.

(10) Patent No.: US 10,298,317 B2
(45) Date of Patent: May 21, 2019

(54) SYSTEMS AND METHODS FOR DYNAMIC SPECTRAL SHAPING IN OPTICAL COMMUNICATIONS

(71) Applicant: Infinera Corp., Annapolis Junction, MD (US)

(72) Inventors: Pierre Mertz, Baltimore, MD (US); Omer Faruk Yilmaz, Palo Alto, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 15/851,369

(22) Filed: Dec. 21, 2017

(65) Prior Publication Data

US 2018/0269964 A1    Sep. 20, 2018

Related U.S. Application Data

(60) Provisional application No. 62/472,611, filed on Mar. 17, 2017, provisional application No. 62/473,083, filed on Mar. 17, 2017.

(51) Int. Cl.
| | |
|---|---|
| *H04J 14/02* | (2006.01) |
| *H04B 10/073* | (2013.01) |
| *H04B 10/296* | (2013.01) |
| *H01S 3/1055* | (2006.01) |
| *G02B 6/42* | (2006.01) |
| *G02B 6/02* | (2006.01) |
| *H01S 5/14* | (2006.01) |

(Continued)

(52) U.S. Cl.
CPC ....... *H04B 10/073* (2013.01); *G02B 6/02061* (2013.01); *G02B 6/29322* (2013.01); *G02B 6/29395* (2013.01); *G02B 6/4202* (2013.01); *G02B 6/4246* (2013.01); *G02B 6/43* (2013.01); *H01S 3/1055* (2013.01); *H01S 5/141* (2013.01); *H04B 10/07955* (2013.01); *H04B 10/296* (2013.01); *H04J 14/02* (2013.01); *H04J 14/0212* (2013.01); *H04J 14/0221* (2013.01); *H04Q 11/0066* (2013.01); *H04Q 2011/0016* (2013.01); *H04Q 2011/0083* (2013.01)

(58) Field of Classification Search
CPC ............ H04B 10/073; H04B 10/07955; H04B 10/296; H04Q 11/0066; H04Q 2011/0083; H04Q 2011/0016; H04J 14/0221; H04J 14/0212; H04J 14/02; H01S 3/1055; H01S 5/141; G02B 6/4246; G02B 6/02061; G02B 6/29322; G02B 6/29395; G02B 6/4202; G02B 6/43
See application file for complete search history.

(56) References Cited

U.S. PATENT DOCUMENTS

2005/0024715 A1 * 2/2005 Inoue .................. H04J 14/0221
                                                                    359/337

* cited by examiner

*Primary Examiner* — Leslie C Pascal
(74) *Attorney, Agent, or Firm* — David L. Soltz

(57) ABSTRACT

A method is described in which a loss of spectrum in an optical signal having an optical signal spectrum is detected. The optical signal is transmitted from a first node to a second node. In response to detecting the loss of spectrum in the optical signal, at least one idler carrier without data imposed is supplied into the optical signal spectrum transmitted from the first node to the second node, the optical signal spectrum encompassing a frequency band including a plurality of optical channels, the idler carrier being amplified stimulated emission light having a frequency corresponding to a first optical channel of the plurality of optical channels.

17 Claims, 12 Drawing Sheets

(51) Int. Cl.
*G02B 6/293* (2006.01)
*G02B 6/43* (2006.01)
*H04Q 11/00* (2006.01)
*H04B 10/079* (2013.01)

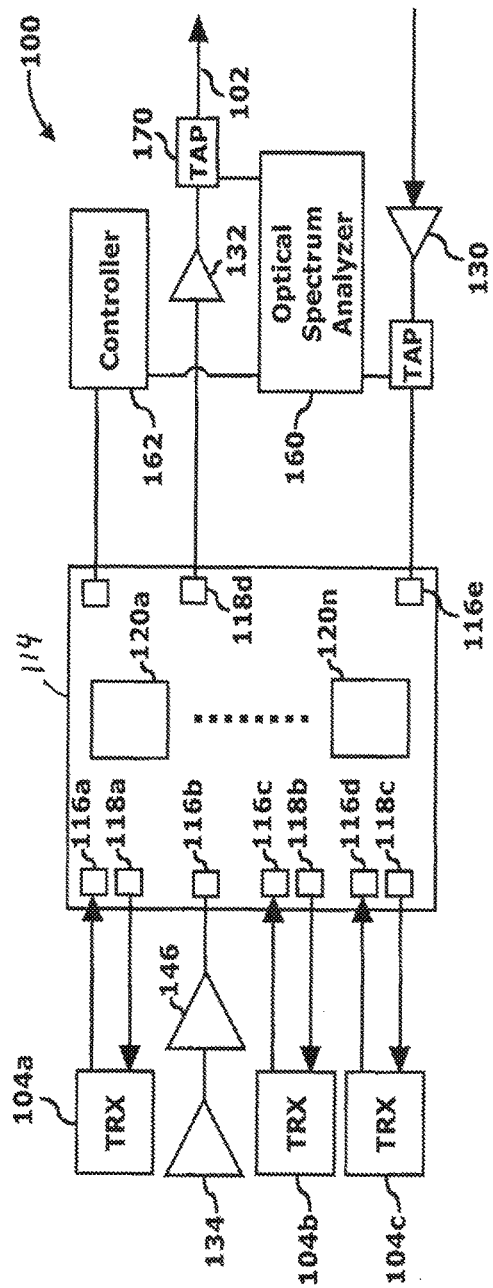
FIG. 4
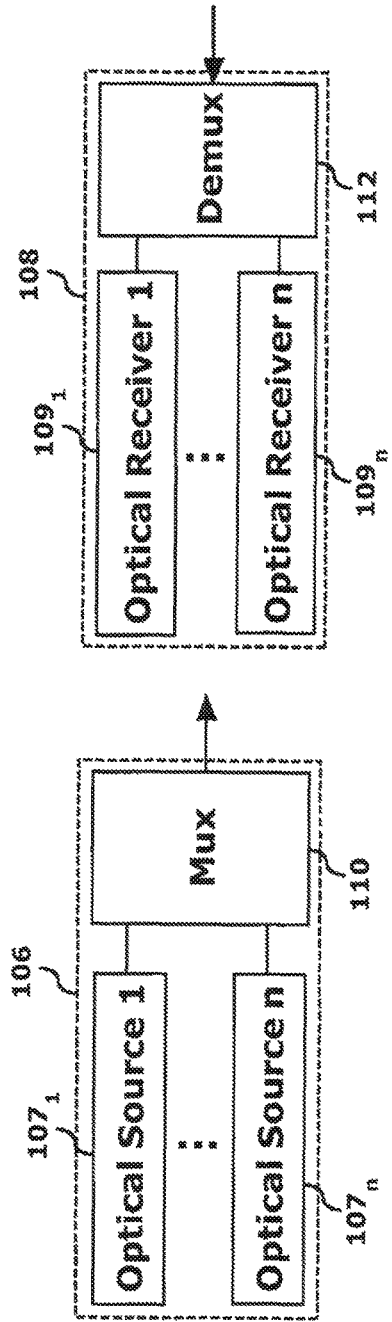
FIG. 5A
FIG. 5B

SYSTEMS AND METHODS FOR DYNAMIC SPECTRAL SHAPING IN OPTICAL COMMUNICATIONS

INCORPORATION BY REFERENCE

The present patent application claims priority to the provisional patent application identified by U.S. Ser. No. 62/472,611, titled "Dynamic Spectral Shaping" and filed on Mar. 17, 2017; and the provisional patent application identified by U.S. Ser. No. 62/473,083, titled "Use of Amplified Spontaneous Emission (ASE) Idler Channels for Optical Bandwidth Loading in Fiber Optical Networks", and filed on Mar. 17, 2017, both of which are hereby incorporated herein by reference.

FIELD OF THE DISCLOSURE

The disclosure generally relates to methods and systems for providing a consistent accumulated line spread at a receiver node within a fiber-optic network. More particularly the disclosure relates to systems and methods for providing a substantially consistent transmitted optical signal power spectrum notwithstanding addition or removal of one or more optical carriers into the transmitted optical signal power spectrum by loading spectral band not used for communicating data with idler carriers providing optical signal power at specific frequencies within the spectral band without data imposed.

BACKGROUND

As shown in FIG. 1, an optical network 8 is comprised of a plurality of nodes 10a and 10b linked together via an optical fiber 12.

The construction and operation of nodes is well known in the art.

Wave-division multiplexing is a type of multiplexing in which two or more optical carriers are multiplexed onto a single optical fiber by using different wavelengths (that is, colors) of laser light.

As shown in FIG. 1, the Nodes 10a and 10b are provided with multiple transceivers 14a, 14b and 14c; a multiplexer/demultiplexer 16; and an optical amplifier 18. The transceiver 14a is coupled to the optical amplifier 18. The optical amplifier includes an Erbium Doped Fiber Amplifier, and/or an optical add/drop multiplexer, such as a fixed optical add/drop multiplexer, or a reconfigurable optical add/drop multiplexer. The transceivers 14b and 14c are coupled to the optical amplifier 18 via the multiplexer/demultiplexer 16. Each of the transceivers 14a, 14b and 14c transmit light in a distinct spectral band.

Amplifier and optical fiber response (transfer function) depends upon loading conditions of the optical fiber. At the end of a link, transfer functions of the line amplifier, fibers, ROADMs, etc. are accumulated. Power differences between different parts of the optical spectrum resulting from the accumulated transfer functions will be referred to as the 'accumulated line spread'.

Shown in FIG. 2 are optical power spectra showing a first loading scenario in which the node 10a transmits a plurality of optical carriers having a first optical signal power spectrum 20, and the node 10b receives a second optical signal power spectrum 22. The first optical signal power spectrum includes a relatively flat level of amplifier noise (Amplified Spontaneous Emission (ASE), with optical data carrying signal channels 1, 2 and 3 at distinct bands within the first optical signal power spectrum 20. As can be seen in FIG. 2, the second optical signal power spectrum 22 includes increases and decreases in the level of relative power levels between the data channels 1, 2 and 3, as well as in the amplifier noise. The shape of the received optical signal power spectrum 22 is referred to as the accumulated line spread of an optical link. As will be appreciated by those skilled in the art, the increase and decrease in the level of power in the second optical signal power spectrum 22 makes it difficult to correctly read the signal at the receiving node 10b due to the changing dynamics of the fiber and amplifier response overtime and over different signal channel loading conditions.

This problem exists regardless of where in an optical signal power spectrum carrier channels are broadcast. Shown in FIG. 3 are waveforms showing a second loading scenario in which the node 10a transmits a plurality of optical carriers forming a third optical signal power spectrum 24, and the node 10b receives a fourth optical signal power spectrum 26. The third optical signal power spectrum includes a relatively constant level of power, with homogenous increases in power at channels 1, 2 and 3 at distinct bands within the third optical signal power spectrum 24. The third optical signal power spectrum 24 includes the channels 1, 2 and 3 at different optical channels than within the first optical signal power spectrum 20. As can be seen in FIG. 3, the fourth optical signal power spectrum 26 includes increases and decreases in the level of power between the optical channels 1, 2 and 3, as well as inhomogeneous power levels within the optical channels 1, 2 and 3. In addition, the accumulated line spread is different from the first loading scenario and is hard to predict.

The problem with unpredictable accumulated line spread is that performance of an optical carrier is optimized at a certain power level, balancing linear and nonlinear penalties. If the line signal loading changes (and thus the accumulated line spread), performance will degrade. For instance, the changes in effective gain, hence the received power changes of signals 1, 2, and 3 will impact the properties of these channels and the quality of the signal. Examples of such properties is the optical signal-to-noise ratio (OSNR) and the amount of degradations accumulated in the link due to the fiber nonlinearities. When the linespread changes, the power of the optical data signal may change significantly. For example, an increase in optical power may increase the nonlinearity based degradations since the nonlinear noise is proportional to the optical power. Or a decrease in optical power will degrade the resulting OSNR. Either of these events may result in degradations of the signal quality. Optical networks and link design has to accommodate design margins for such changes to absorb these kind of changes, limiting the performance and signal reach. Moreover, the dynamic range the optical networking hardware designed for has to be very large in order to accommodate low and maximum loading/capacity conditions.

SUMMARY

Line amplifier dynamics (i.e., EDFA, Raman), interactions in optical fiber (Signal-Signal Raman gain, etc.) are likely to change based on loading condition changes (such as number of optical channels in the fiber link and/or the wavelength of the present optical channels, etc.) In other words, amplifier and optical fiber dynamics differ when the wavelength of the optical carriers for existing optical channels change and this causes changes in the accumulated line spread. The problem of the rather unpredictable nature of accumulated line spread is addressed with systems and methods for providing a substantially consistent transmitted optical signal power spectrum notwithstanding additions or removal of one or more optical carriers into the transmitted optical signal power spectrum by loading spectral band not used for communicating data with idler carriers providing optical power matching the power of data carrying optical signal carriers (e.g., similar average power spectral density as the optical carriers) at specific frequencies within the spectral band without data imposed. This permits changes in the loading conditions of the optical fiber, without substantially effecting the accumulated line spread. In the event of a failure of the optical carrier, the disclosure describes how to replace the optical carrier with an idler carrier to minimize any change in accumulated line spread. This way the signal loading changes are automatically handled such that the fiber's optical loading is reverted back to optimal and/or minimally affected.

Having a predictable accumulated line spread alleviates power controls and management requirements in the link (for line amplifiers) and in the terminal optics and the transceiver optics. This allows a reduction of (a) number of control loops, and/or (b) complexity of the control loops, and/or (c) required calibration set points for line amplifiers, and/or (d) problems associated with allocated power margin/dynamic range requirements for the transceivers, and/or (e) power tracking requirements in the transceivers.

Having a predictable accumulated line spread also improves link performance due to better optimized parameters. This permits a reduction in (a) output operating power dynamic range of optical amplifiers/components, (b) optimization conditions of the hardware properties such as noise figure, ripple, etc., and (c) calibration based error independent from amplifier/fiber dynamics.

The presently disclosed system and method decreases the line-spread changes to the optical link experience. Once the link is optimized the changes will be small since the ASE idler will fill the optical bandwidth. This way the fiber network is operated at or close to max loading/capacity conditions, and power and noise changes due to line-spread changes are decreased. The presently disclosed systems and methods also decreases the dynamic range needed for hardware design and operating conditions. This way, hardware can be better optimized for a narrow dynamic range for better performance. Also, the burden for high margins in the optical link design will be alleviated, resulting in better reach and/or signal performance and/or fiber data capacity.

In some use cases, the control SW will do the orchestration for signal/ase idler loading changes so that it maintains the fiber loading above a pre-determined threshold percentage.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 4 is a schematic diagram of a physical layer of an optical interface of a node constructed in accordance with one embodiment of the present disclosure that loads spectral band not used for communicating data with idler channels providing optical signal power at specific wavelengths without imposition of data.

FIG. 5A is a schematic diagram of an exemplary transmitter constructed in accordance with the present disclosure.

FIG. 5B is a schematic diagram of an exemplary receiver constructed in accordance with the present disclosure.

DETAILED DESCRIPTION

Figure 1:
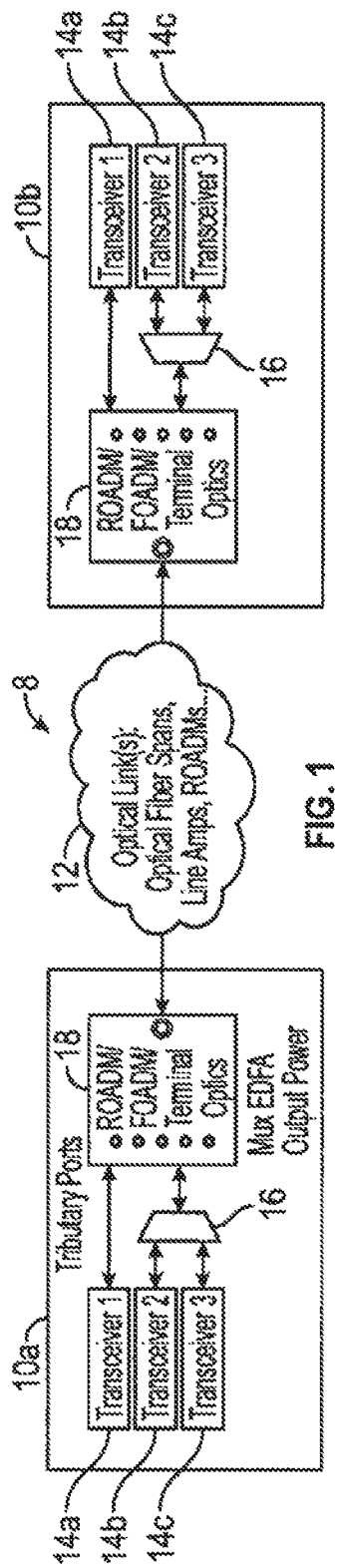
FIG. 1 is a block diagram of an exemplary prior art optical network.

The following detailed description refers to the accompanying drawings. The same reference numbers in different drawings may identify the same or similar elements.

The mechanisms proposed in this disclosure circumvent the problems described above. The present disclosure improves upon the optical node by including a switching mechanism that can provide or remove idler carriers into the transmitted optical signal power spectrum. The problem of the rather unpredictable nature of accumulated line spread is addressed with systems and methods for providing a substantially consistent transmitted optical signal power spectrum notwithstanding dynamic provisioning of optical spectrum by optical nodes in which not all of the available capacity is used to carry data, or a loss of one or more optical carriers in the transmitted optical signal power spectrum. Providing a substantially consistent transmitted optical signal power spectrum can be obtained by determining time periods and wavelengths of unused optical spectrum and loading at least one idler carrier without data imposed to load the unused optical spectrum. In other embodiments, this can also be accomplished by detecting a loss of spectrum in the optical signal and loading at least one idler carrier without data imposed thereon to replace the lost spectrum, thereby providing optical signal power within the lost spectral band that does not have data imposed thereon. In either instance, this permits changes in the data-carrying-signal loading conditions of the optical fiber, without substantially affecting the accumulated line spread since the overall loading is mostly maintained.

DEFINITIONS

If used throughout the description and the drawings, the following short terms have the following meanings unless otherwise stated:

BW stands for Bandwidth. Bandwidth is the data transfer capacity of a link or connection in the Optical Transport Network, which may be expressed in optical data units, bits per second, number of spectral slots, or expressed by other methods.

DWDM stands for dense wavelength division multiplexing. DWDM multiplexes multiple optical carrier signals, such as data-carrying Optical Channel (OCh) signals, onto a single optical fiber by using different laser light wavelengths (colors).

EDFA stands for Erbium-doped fiber amplifier, which is an optical repeater device that is used to boost intensity of optical signals being carried through a fiber optic communication system.

Idler carrier, as used herein, means an optical signal having a frequency corresponding to an optical channel at a defined particular wavelength (frequency) without data imposed.

The term "optical carrier", as used herein, means an optical signal at a defined particular wavelength corresponding to an optical channel.

The term "optical channel" is commonly used by those skilled in the art to mean a defined particular wavelength (frequency). Data can be imposed on the optical channel by encoding data into an optical carrier at the defined particular wavelength. Encoding data can be accomplished by varying signal strength, varying the base frequency, varying the wave phase, and/or other means.

OTN stands for Optical Transport Network which includes a set of optical switch nodes which are connected by optical fiber links. ITU-T recommendations G.709 and G.872 define OTN interface requirements and network architecture respectively.

Substantially, as used herein referring to spectral power density, means optical power spectral power density that is a measure of optical power distribution over bandwidth supported by the fiber and optical network equipment within an acceptable range depending on characteristics of the optical link, type of amplification being used. For instance, an acceptable range may be within plus or minus 10%.

As used herein, loading the spectral band refers to a combination of optical carrier wavelengths and idler carrier wavelengths that occupy spectrum available on that particular band, depending on the application and link design margins. For example, the infrared C-Band refers to a wavelength range between approximately 1530 nm and 1565 nm.

DESCRIPTION

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more and the singular also includes the plural unless it is obvious that it is meant otherwise.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

In accordance with the present disclosure, the components of the nodes include circuitry. Circuitry, as used herein, could be analog and/or digital components, or one or more suitably programmed microprocessors and associated hardware and software, or hardwired logic. Also, certain portions of the implementations may be described as "components" that perform one or more functions. The term "component," may include hardware, such as a processor, an application specific integrated circuit (ASIC), or a field programmable gate array (FPGA), or a combination of hardware and software. Software includes one or more computer executable instructions that when executed by one or more component cause the component to perform a specified function. It should be understood that the algorithms described herein are stored on one or more non-transitory memory. Exemplary non-transitory memory includes random access memory, read only memory, flash memory or the like. Such non-transitory memory can be electrically based or optically based. Further, the optical signals described herein may be generated by the components and result in various physical transformations.

FIG. 4 shows a physical layer of a node 100, which may be a terminal node consistent with the present disclosure. The node 100 is configured to insert optical carriers, for example, modulated optical signals, each having a different wavelength onto an optical fiber link 102, such as a subsea line system via Dynamic Spectral Sharing (DSS), i.e., loading at least one portion of the optical spectrum with an idler carrier to compensate for lack of an optical carrier. As described in greater detail below, loading the optical signal spectrum with idler carriers that may be generated using an amplified stimulated emission (ASE) light source, consistent with the present disclosure, may be provided to protect traffic in the event of failure of one or more transmitters supplying optical carriers within the dynamically shared spectra, such as signal loss from the output from one or more transmitters, for example, shown in FIGS. 4, 5A and 5B.

The node 100 may include a plurality of transceivers 104a, 104b and 104c, which, as shown in FIG. 5A may include a transmitter 106 that includes one or more optical sources $107_{1-n}$ to output modulated optical signals (e.g., on-off-keying (OOK), polarization multiplexed BPSK, QPSK, m-quadrature amplitude modulated (QAM, m being an integer, modulated optical signals). Each transceiver 104a, 104b, and 104c also includes a receiver 108, which may include multiple optical receivers $109_{1-n}$ as shown in FIG. 5B. The optical receivers $109_{1-n}$ may each be a coherent receiver (e.g., having four photodiodes arranged in a predetermined pattern for optical to electrical signal conversion) configured to receive, demodulate, and extract data from received modulated optical signals. Optical signals input/output to transceivers 104a, 104b and 104c may have different modulation formats. For example, optical signals input/output by transceiver 104a may have a first modulation format while optical signals input/output to transceiver 104b may have a second modulation format different than the first modulation format. The outputs of the optical sources $107_{1-n}$ may be multiplexed together using wavelength division multiplexing, for example.

When the transmitter 106 includes multiple optical sources 107, the transmitter 106 may also be provided with a multiplexer 110. The multiplexer 110 can be a wavelength division multiplexer that combines optical carriers generated by the optical sources 107 onto a single waveguide. When the receiver 108 includes multiple optical receivers 109, the receiver 108 may also include a demultiplexer 112. The demultiplexer 112 can be a wavelength division demultiplexer that receives and demultiplexes multiple optical carriers from a single waveguide.

As further shown in FIG. 4, multiple optical carriers (some of which may be wavelength division multiplexed together), may be supplied from the transceivers 104a, 104b, and 104c to a wavelength selective switch 114. The wavelength selective switch 114 can be a commercially available wavelength selective switch, for example.

As generally understood, the wavelength selective switch 114 may comprise a plurality of input optical ports 116 (that are designated in FIG. 4 with the reference numerals 116a-e), a plurality of output ports 118 (that are designated in FIG. 4 with the reference numerals 118a-d), and an array of optical switching elements 120a-120n that switch and/or multiplex one or more input ports 116 to one or more output ports 118. The switching elements 116a-116n operate on light that has been dispersed in wavelength without the requirement that the dispersed light be physically demultiplexed into separate ports. Alternatively, various incoming channels or modulated optical signals/carriers of a common port are dispersed continuously onto a switching element which then directs and attenuates each of these optical channels independently to the output ports 118 of the wavelength selective switch 114. The dispersive mechanism may be based on holographic or ruled diffraction gratings.

In this case, modulated optical signals or optical carriers input to the input ports 116a, 116b, 116c and 116d may be multiplexed, and supplied to a desired output port(s) 118d. Optical signals input to the wavelength selective switch 114 may be amplified by a first amplifier 130 and optical signals output from the wavelength selective switch 114 may be similarly amplified by a second amplifier 132. The first and second amplifiers 130 and 132 can be erbium doped fiber amplifiers, for example.

Consistent with the present disclosure, an idler light source 134 separate from the transceivers 104a, 104b and 104c may be further provided that is optically coupled to the input port 116b of the wavelength selective switch 114. The idler light source 134 may be an amplified spontaneous emission light source. The idler light source 134 will be described hereinafter as generating amplified spontaneous emission light (ASE light) having a spectrum encompassing a C-band, an L-band and/or an S-band, for example. The spectrum of ASE light can be in C-Band, for example between 1520 nm to 1570 nm. The output of the idler light source 134 can be fed through a third amplifier 146. For example, the idler light source 134 may generate and output first ASE light. The first ASE light is fed to the third amplifier 146, which amplifies the first ASE light to a desired power or intensity. In the event, one of the transmitters 106 is disabled or a loss of signal (LOS) is detected, ASE light from the idler light source 134 input to the wavelength selective switch 114 may be spectrally shaped to correspond to the spectrum and power of the optical carriers corresponding to optical channels that would otherwise be output from the disabled transmitters 106. As a result, desired power characteristics of channels or carriers output from the remaining transmitters 106 can be maintained, as discussed below. Once the disabled transmitter 106 is rendered operable, the idler light source 134 can be disabled or turned off, and transmission can resume from the repaired transmitter 106 or wavelength selective switch can be switched to signal port. The node 100 is also provided with an optical spectrum analyzer 160, and a controller 162 configured to permit dynamic shaping of the optical signal output by the node 100. The optical spectrum analyzer 160 reads an optical spectrum of the optical signals being provided to the optical fiber 102 by the node 100 via first tap 170. For example, the optical spectrum analyzer 160 can read the optical spectrum of the optical signals subsequent to the second amplifier 132. In one embodiment, the optical spectrum analyzer 160 reads a first optical signal spectrum to obtain a baseline profile of optical power corresponding to frequency (or wavelength) being supplied to the optical fiber 102 by the node 100. The readings of the optical spectrum analyzer 160 can be supplied as electrical signals to the controller 162, which uses the readings to add/remove an idler carrier depending upon desired and/or unexpected additions/removals of optical carriers.

While node 100 is shown having first and second amplifiers 130 and 132 as part of the node 100. It should be noted that separate terminal line amplifiers (not shown) such as erbium-doped fiber amplifiers (EDFA), for instance, may be included on input and output transmission lines and, therefore, not necessary as part of the node 100. In other words, the input and output signals may be amplified in-line before/after the node 100 so internal amplifiers are not necessary in such an embodiment.

An example of a process for adding/removing an idler carrier and removing/adding optical carriers to particular optical channels will next be described.

To add an optical carrier corresponding to an optical channel into the optical spectrum, the controller 162 may start with the idler light source 134 generating an idler carrier at the wavelength of the optical carrier to be added. The controller 162 actuates one of the transceivers 104a, 104b or 104c to generate and supply the optical carrier to the wavelength selective switch 114. The controller 162 also directs the wavelength selective switch 114 to replace the idler carrier with the optical carrier.

The idler light source 134 can also be used for system protection by replacing a failed optical carrier with an idler carrier generated by the idler light source 134 upon detection by the controller 162 of a loss of an incoming optical carrier. The controller 162 can detect the loss of an incoming optical carrier by monitoring the output of the second amplifier 132. The controller 162 can monitor the output of the second amplifier by comparing a reading of the optical spectrum analyzer 160 to the baseline profile stored by the controller 162. When a loss of an incoming optical carrier is detected, the controller 162 sends a signal to the wavelength selective switch 114 directing the wavelength selective switch 114 to replace the lost optical carrier with an idler carrier from the idler light source 134.

To replace the failed optical carrier, the controller 162 gradually replaces the optical carrier with the idler carrier. This can be accomplished by turning off the optical carrier port for the spectral region of the failed optical carrier, shaping the wavelength selective switch profile to match the baseline spectrum in the spectral region of the failed optical carrier, then turning on the input port 116b receiving the ASE light for that spectral region.

Figure 6A:
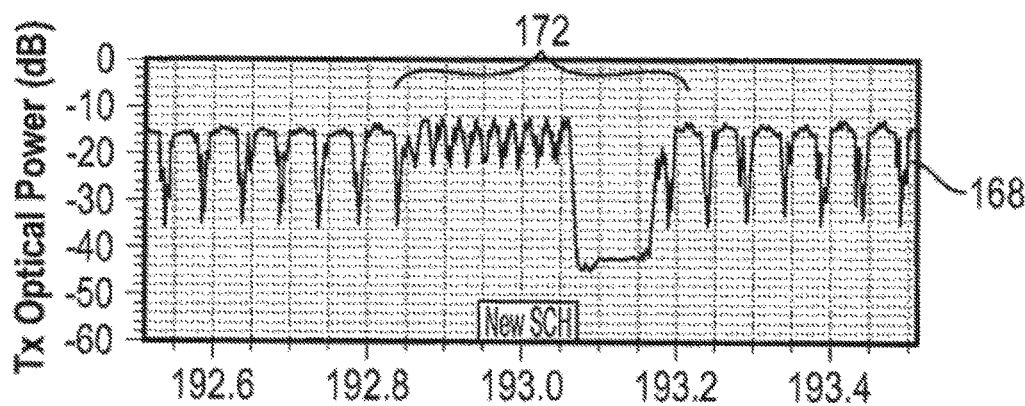
FIG. 6A is a graph showing an exemplary baseline transmitted optical signal power spectrum in accordance with the present disclosure.
Figure 6B:
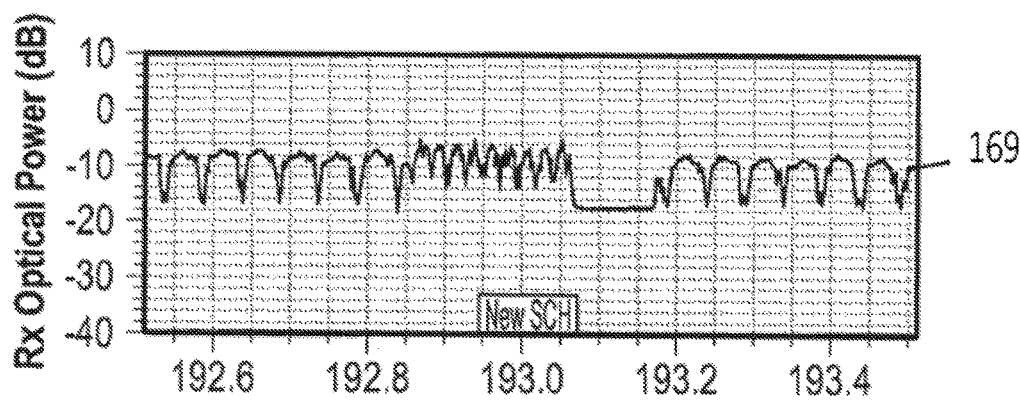
FIG. 6B is a graph showing an exemplary baseline received optical signal power spectrum in accordance with the present disclosure.

FIG. 6A is a graph showing an exemplary baseline transmitted optical signal power spectrum 168 read by the optical spectrum analyzer 160 in accordance with the present disclosure. In this example, an initial transmitter configuration is shown with multiple idler carriers 172 being used in the middle of the spectrum rather than optical carriers. Thus, the node 100, in this example, is configured to accept and implement new shared spectra. FIG. 6B is a graph showing an exemplary baseline of received optical signal power spectrum 169 in accordance with the present disclosure.

In this example, dynamically shared optical carriers can be inserted into the optical fiber. To obtain a smooth transition from the idler carriers to optical carriers only ~50 GHz of spectral space is exchanged between the idler light source 134 and signal per step while the optical spectrum analyzer 160 continuously reads and provides updated information as to the spectrum being read at the output of the node 100. In one example, the controller 162 will not proceed without operator direction, thus allowing the operator to observe any impact on adjacent optical carriers and make adjustments if necessary. In one example, no mid-insertion optimization to existing wavelengths is necessary. The controller 162 is programmed to allow step reversion if unanticipated results are obtained.

Before any ASE protection takes place, a baseline profile of the node 100 is preferably taken. This baseline records the TX optical power of all idler carriers and optical carriers.

Figure 7A:
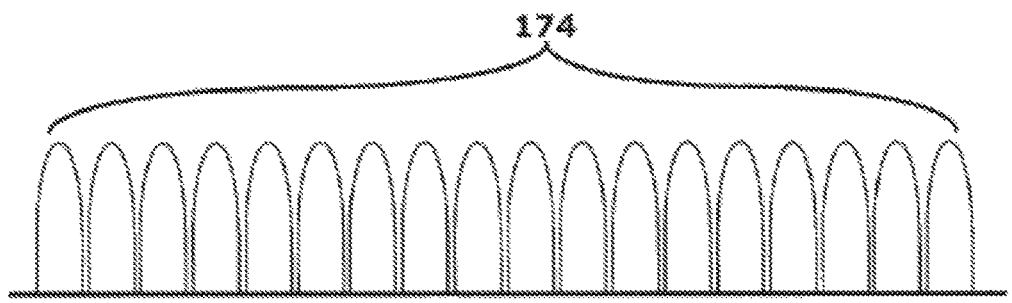
FIG. 7A is a graph showing a transmitted optical signal power spectrum prior to removal of one or more data optical carriers having data encoded.

Preferably, the shape of the idler carrier(s) should be determined with the baseline profile such that upon insertion, the spectrum and power of the optical signal supplied to the optical fiber matches or substantially matches the lost spectral power. Simply replacing lost power with an idler carrier of a similar peak power will result in greater total power than that of the initial carriers. This may affect power per channel in the spectrum and reduced quality factors (Qs). Applying an idler carrier with a peak power delta only may affect tilt, perturbing system pre-emphasis optimization. Consistent with the present disclosure, these issues are resolved by replacing lost spectrum with one or more idler carrier(s) shaped to mimic the lost carrier power spectrum. This ensures minimal impact on channel optimization when idler carrier substitution occurs. In FIGS. 7A and 7J this effect is visible on the legacy wavelengths.

FIG. 7A is a graph showing a transmitted optical signal power spectrum 174 having a plurality of optical data carriers having data encoded prior to removal of one or more of the optical data carriers.

Figure 7B:
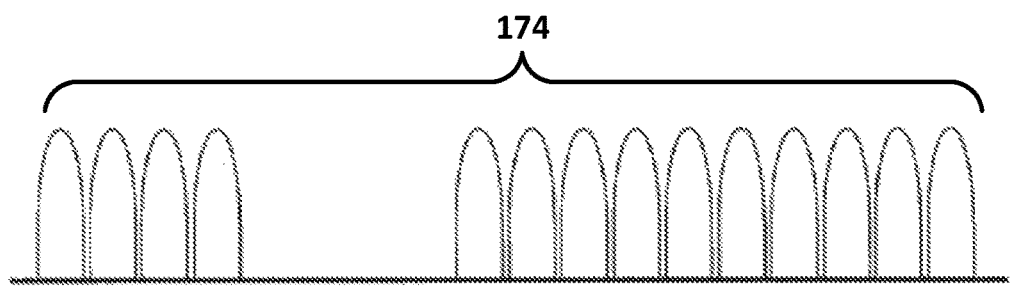
FIG. 7B is a graph showing a transmitted optical signal power spectrum after removal of one or more data optical carriers.

FIG. 7B is a graph showing the transmitted optical signal power spectrum 174 after removal of one or more optical data carriers.

Figure 7C:
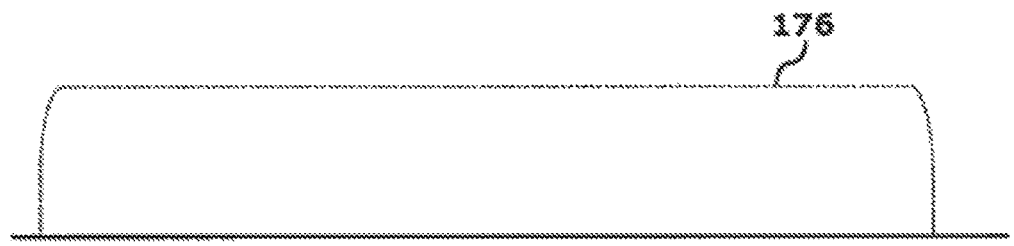
FIG. 7C is a graph showing the optical signal spectrum transmitted by an Amplified Spontaneous Emission light source (referred to herein as an ASE light source).
Figure 7D:
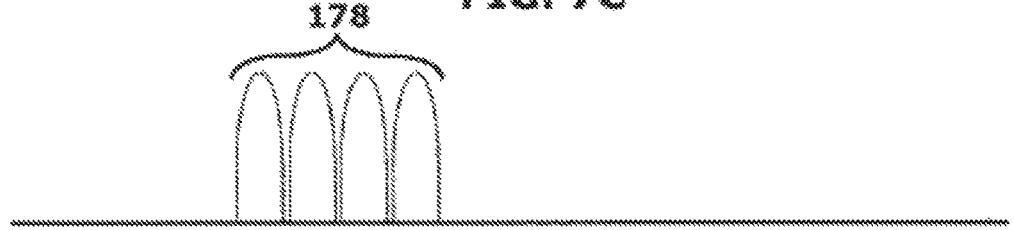
FIG. 7D is a graph showing the idler carrier signal spectrum of FIG. 7C as filtered by a tunable optical filter.

FIG. 7C is a graph showing an idler optical signal spectrum 176 as produced by the idler light source 134. The idler optical signal spectrum 176 may be shaped by the wavelength selective switch 114 to form idler carrier signals 178 as illustrated by the graph in FIG. 7D.

Figure 7E:
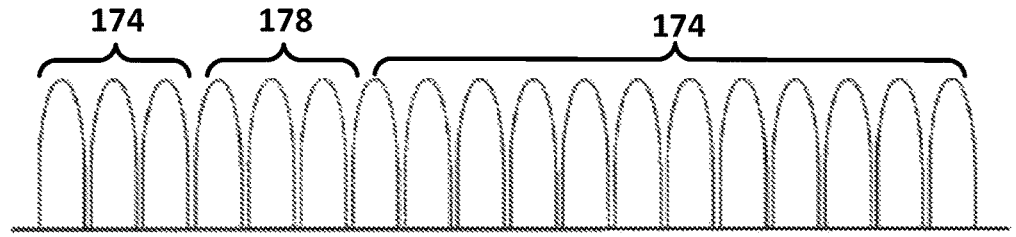
FIG. 7E is a graph showing the filtered idler carrier signal of FIG. 7D as inserted to replace the one or more data optical carriers that were removed from the transmitted optical signal power spectrum of FIG. 7A.

FIG. 7E is a graph showing the idler carrier signals 178 as inserted to replace the one or more optical data carriers that were removed from the transmitted optical signal power spectrum 174, the idler carrier signals 178 providing optical signal power within the spectral band previously occupied by the one or more optical data carriers that were removed.

Figure 7F:
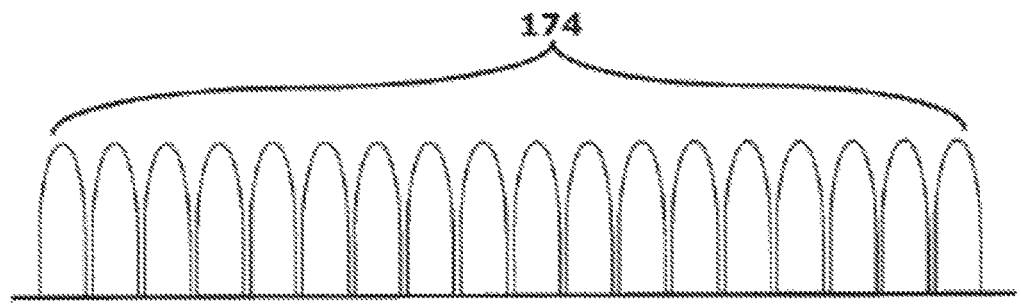
FIG. 7F is a graph showing a transmitted optical signal power spectrum after the removed data optical carriers have been reinstated and the idler carrier signal removed.

FIG. 7F is a graph showing the transmitted optical signal power spectrum 174 after the idler carrier signal 178 has been removed and the removed data optical carriers have been replaced.

Figure 7G:
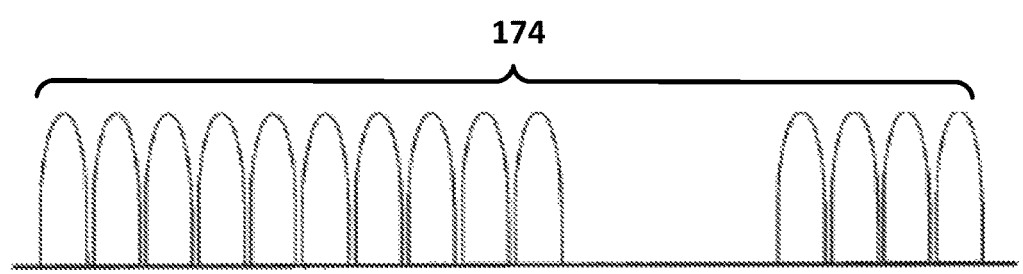
FIG. 7G is a graph showing a transmitted optical signal power spectrum after removal of one or more second data optical carriers.

FIG. 7G is a graph showing the transmitted optical signal power spectrum 174 after removal of one or more second data optical carriers.

Figure 7H:
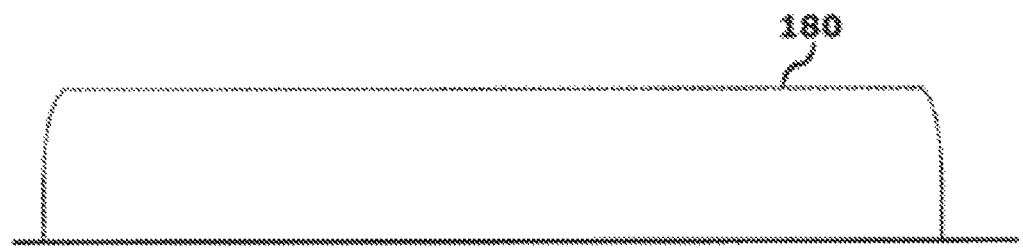
FIG. 7H is a graph showing a second idler carrier signal spectrum transmitted by an ASE light source.

FIG. 7H is a graph showing a second idler optical signal spectrum 180 produced by the idler light source 134. The second idler optical signal spectrum 180 may be shaped by the wavelength selective switch 114 to form a second idler carrier signal 182 as illustrated by the graph in FIG. 7I.

Figure 7I:
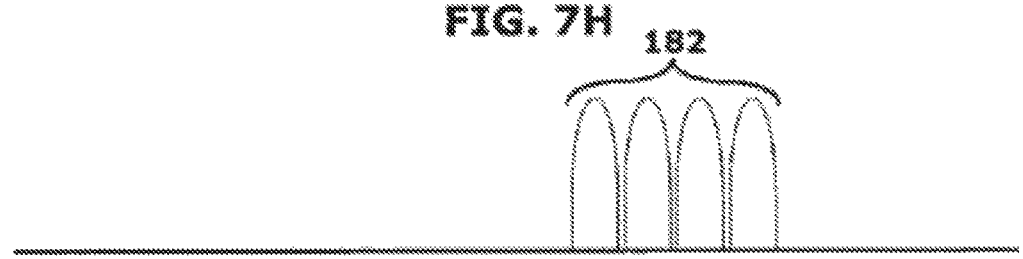
FIG. 7I is a graph showing the second idler carrier signal spectrum of FIG. 7H as filtered by a tunable optical filter to form a second filtered idler carrier signal.
Figure 7J:
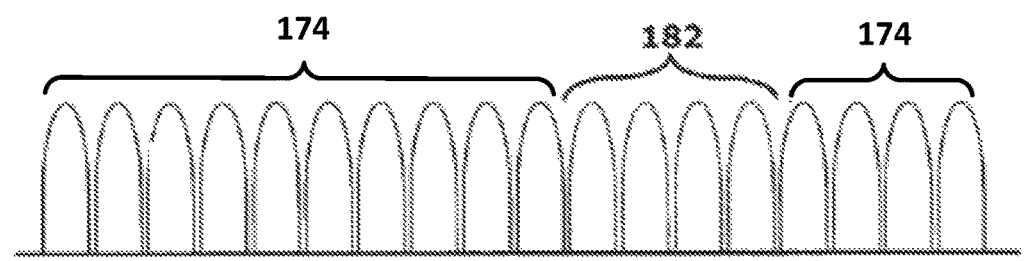
FIG. 7J is a graph showing the second filtered idler carrier signal of FIG. 7I as inserted to replace the one or more second data optical carriers that were removed from the transmitted optical signal power spectrum of FIG. 7A.

FIG. 7J is a graph showing the second idler carrier signal 182 of FIG. 7I as inserted to replace the one or more second data optical carriers that were removed from the transmitted optical signal power spectrum 174.

Figure 2:
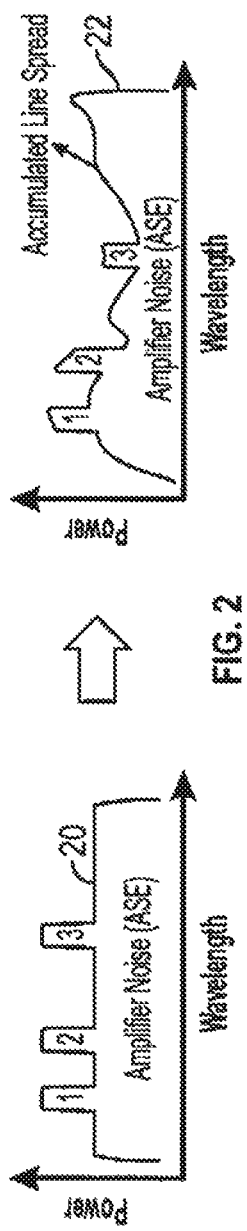
FIG. 2 is a schematic diagram of a first prior art loading scenario in which a first node transmits a first optical signal power spectrum, and a second node receives a second optical signal power spectrum.
Figure 2:
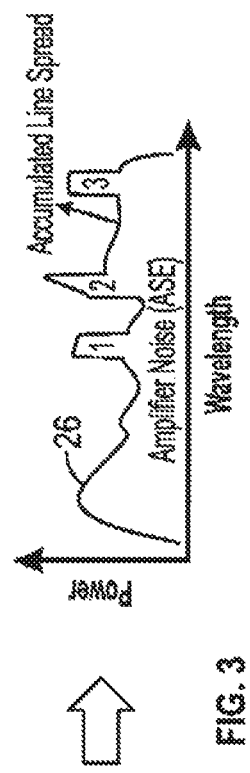
Figure 7K:
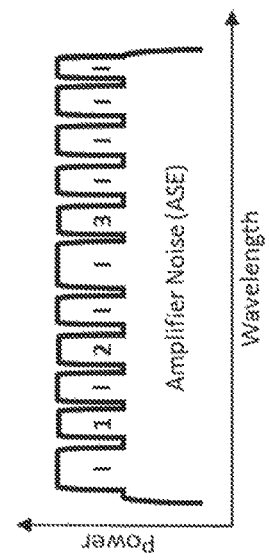
FIG. 7K is a schematic diagram of a loading scenario in which a transmit node transmits a first optical signal power spectrum comprising optical data carriers (1,2,3) and idler carrier signals (I), and a receive node receives a second optical signal power spectrum comprising optical data carriers and idler carrier signals.
Figure 7K:
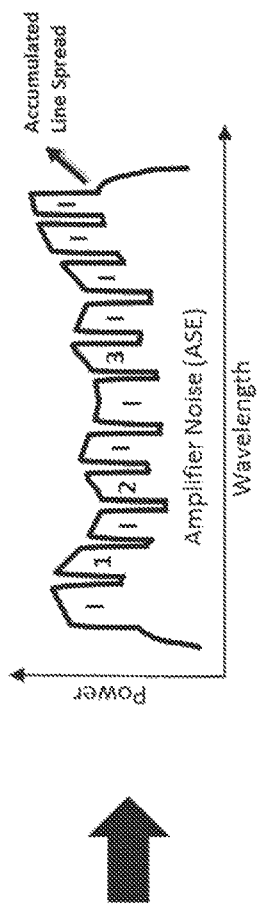

FIG. 7K is a graph showing a loading scenario similar to the one shown in FIG. 2. As shown in FIG. 7K, a transmit node (not shown), constructed and operated in accordance with the inventive concepts disclosed herein, transmits a first optical signal power spectrum 190 and a receive node (not shown), constructed and operated in accordance with the inventive concepts disclosed herein, receives a second optical signal power spectrum 191. The first optical signal power spectrum 190 includes optical data carrier channels 1, 2, and 3 at distinct bands within the first optical signal power spectrum 190 and idler carrier signals I. In accordance with one embodiment of the presently disclosed inventive concepts, the idler carrier signals I that have been inserted fill/replace optical data carrier channels that are either not in use or are not being transmitted because a transmitter has failed or is not enabled to provide an optical data carrier channel, for instance.

Figure 3:
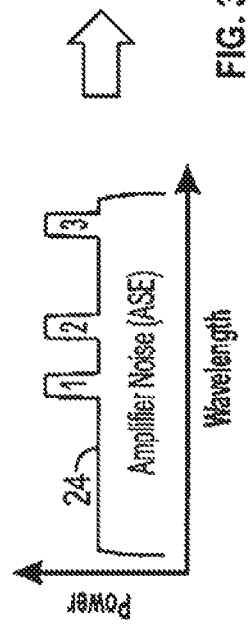
FIG. 3 is a schematic diagram of a second prior art loading scenario in which the first node transmits a third optical signal power spectrum, and the second node receives a fourth optical signal power spectrum.
Figure 7L:
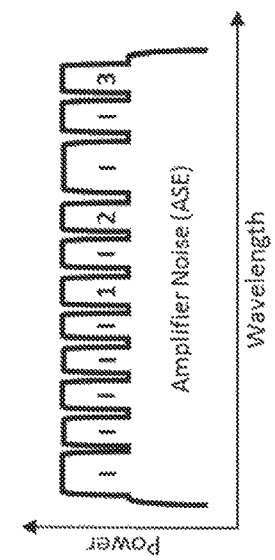
FIG. 7L is a schematic diagram of a second loading scenario in which the transmit node transmits a third optical signal power spectrum comprising optical data carriers (1,2,3) and idler carrier signals (I), and the receive node receives a fourth optical signal power spectrum comprising optical data carriers and idler carrier signals.
Figure 7L:
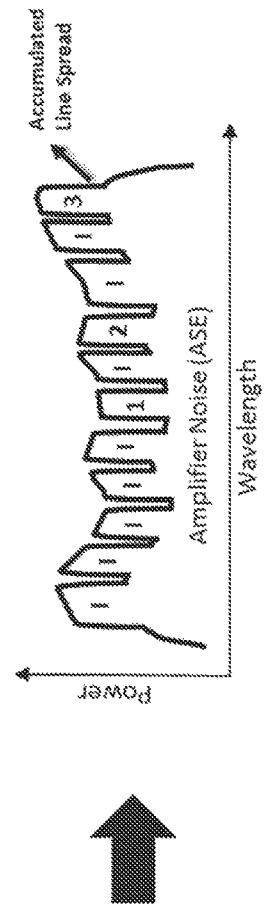

Shown in FIG. 7L are waveforms showing a second loading scenario, similar to the loading scenario illustrated in FIG. 3. As shown in FIG. 7L, the transmit node transmits a third optical signal power spectrum 195 and the receive node receives a fourth optical signal power spectrum 196. The third optical signal power spectrum 195 includes optical data carrier channels 1, 2, and 3 at distinct bands within the third optical signal power spectrum 195 and idler carrier signals I. In accordance with one embodiment of the presently disclosed inventive concepts, the idler carrier signals I that have been inserted fill/replace optical data carrier channels that are either not in use or are not being transmitted because a transmitter has failed or is not enabled to provide an optical data carrier channel, for instance.

As will be appreciated by a person of skill in the art having the benefit of the presently disclosed inventive concepts, the accumulated line spread of the second and fourth optical signal power spectrums 191 and 196 are substantially consistent despite the signal loading changes between the first loading scenario and the second loading scenario. By loading unutilized channels (called idler channels) and/or disabled channels with noise signals, the information signals on utilized channels will not draw all of the power from optically pumped fiber amplifiers in repeaters. Instead, the noise signals carried in the idler channels will draw a proportionate share of the repeater's power as if the noise signals were information signals. In this way, all WDM channels will appear to be loaded, even if some of the channels are loaded with noise.

In some cases, e.g. terrestrial amplifiers operating in constant gain control mode, the average gain of the amplifiers and maintained by the optical networking hardware and its controls. However, the linespread may drastically change, as shown in the FIG. 2 and FIG. 3. In such cases, the ASE idler filling of the rest of the available optical bandwidth makes the line spread minimally changes, as shown in the FIGS. 7K and 7L, respectively.

Keeping the optical loading constant results in constant Raman Gain imposed by signals on the lower wavelengths and on the higher wavelength optical signals. This is also known as the signal-signal Raman gain by those skilled in the art.

Keeping the loading constant also results in maintaining similar dynamics in amplifiers such as EDFAs. The strong effects of spectral hole burning and wavelength dependent gain shapes of the amplifiers typically show when the channel loading characteristics change. Maintaining a high loading, reduces changes that can be imposed spectrum, i.e. the accumulated line-spread.

In one embodiment, replacement of lost optical carriers with shaped Amplified Spontaneous Emission can be achieved by adjusting the wavelength selective switch 114 to shape the Amplified Spontaneous Emission to the baseline profile of power data recorded by the optical spectrum analyzer 160 during setup. As FIGS. 7A and 7J show, this ASE replacement is not dependent on the number or spacing of the lost optical carriers; the ASE replacement may depend only on information indicative of optical carriers to be replaced by idler carriers, such as by shaping the ASE replacement in accordance with the recorded baseline profile.

Reinsertion of optical carriers may be performed via the wavelength selective switch 114 by replacing shaped ASE light with optical carrier signals generated by one or more of the transceivers 104a, 104b and 104c. To return optical carriers back to their original performance, an optimized attenuation vs. frequency profile that is known in the art as an WSS attenuation profile can also be retuned. The WSS attenuation profile is a per spectral slice attenuation applied across the entire C-Band, its granularity is determined by the WSS technology (e.g. 12.5 GHz or 6.25 GHz or etc.). In this example, there are 384 spectral slices across the C band based on WSS's 12.5 GHz slice granularity. The WSS attenuation profile can be retuned by the controller 162 instructing the wavelength selective switch 114 to shape the light to be consistent with the baseline profile before re-insertion. After insertion of the optical carriers, the baseline profile can be adjusted by the operator, or in a control loop to optimize the performance of the optical carriers.

Consistent with the inventive concepts disclosed herein, retuning of the WSS attenuation profile may be done by an operator adjusting the profile through a graphical user interface (GUI) or command line interface (CLI), or automatically through an automated optimization algorithm. When adjusted through a GUI, the GUI may be programmed to not proceed without operator confirmation, thus allowing the operator to observe any impact on adjacent carriers and make adjustments and/or optimization if necessary. The GUI may be programmed to allow step reversion if unanticipated results are obtained thus ensuring a smooth transition between carrier signals and idler signals and vice-versa.

Loading of the optical signal with one or more idler carriers, e.g., Dynamic Spectral Sharing consistent with the present disclosure may protect traffic in the event of potentially disruptive power changes, and enable risk-free introduction of new (and recovered) optical carrier wavelengths to an operating communication system.

Figure 8:
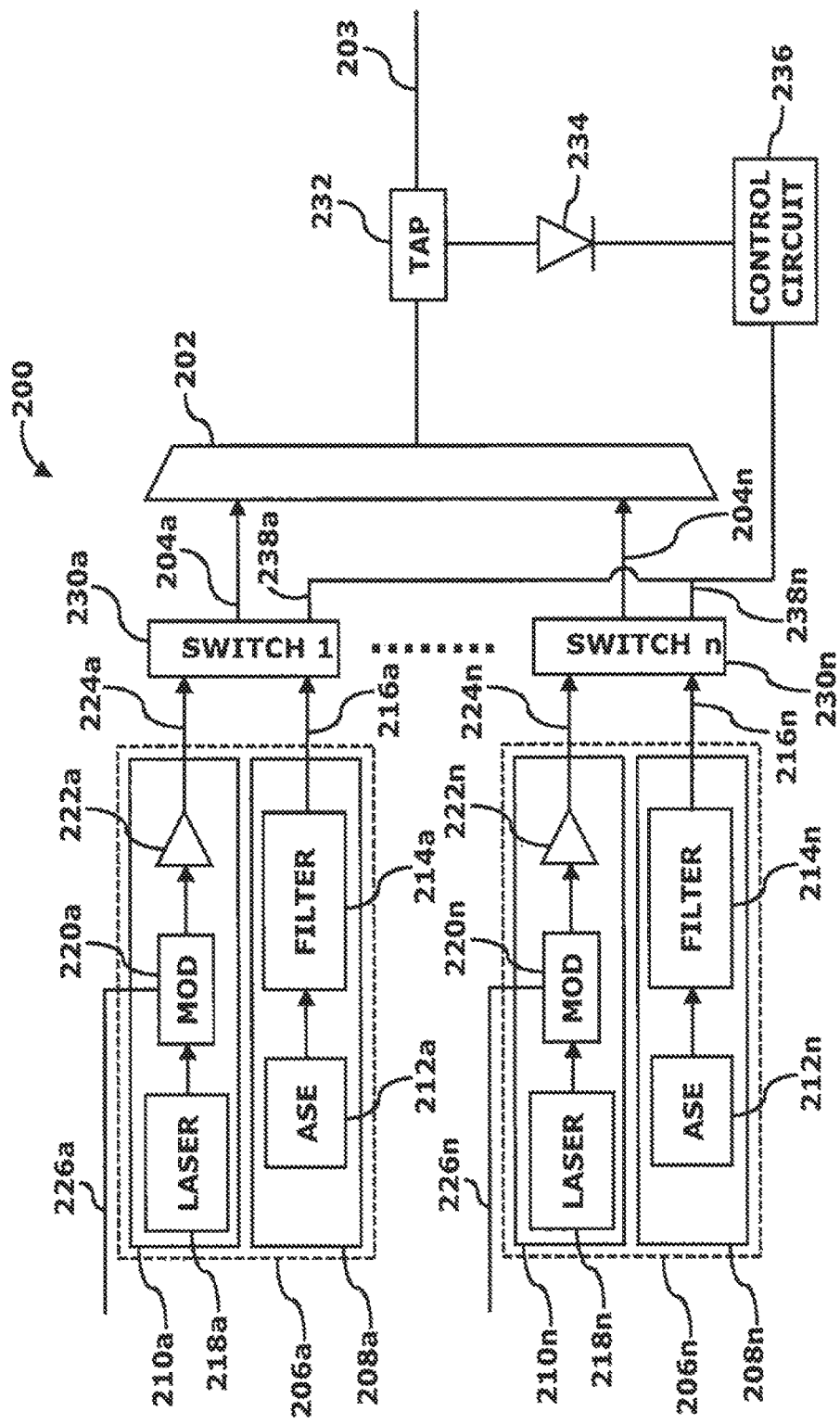
FIG. 8 is a schematic diagram of a physical layer of an optical interface of a node constructed in accordance with one embodiment of the present disclosure that loads spectral band not used for communicating data with idler channels providing optical signal power at specific wavelengths without imposition of data.

FIG. 8 illustrates a physical layer of a node 200 which may be a terminal node consistent with one embodiment of the present disclosure. The node 200 includes a multiplexer 202 to produce the source signal to be carried on optical fiber link 203. In this embodiment, the node 200 is provided with transmitter systems 206a-206n having optical ports optically coupled with switches 230a-230n. Switches 230a-230n are optically coupled with input ports of multiplexer 202 through output optical cables 204a-204n. The switches 230a-230n receive filtered noise signals from one or more backup transmitters 208a-208n carried on filter output optical cables 216a-216n and transmission signals from one or more transmitters 210a-210n carried on transmitter optical cables 224a-224n. Backup transmitters 208a-208n include one or more ASE light sources 212a-212n coupled through optical filters 214a-214n to provide one or more predetermined spectral bands of light to filter output optical cables 216a-216n. ASE light sources 212a-212n may be any known broadband noise source. ASE light sources 212a-212n may include an equalizer at the output so that the spectral power density of the optical noise signal is equal at every wavelength across the bandwidth of node 200.

The one or more transmitters 210a-210n are provided with laser sources 218a-218n coupled through modulators 220a-220n to amplifiers 222a-222n. Modulators 220a-220n may be electro-optical modulators of known type or electroacoustic modulators of known type. In either event, modulators 220a-220n modulate the optical output signal from laser sources 218a-218n based on electrical information (e.g., a bit stream) on modulator control input lines 226a-226n. For example, a bit stream of data may be encoded into a return to zero electrical signal (RZ signal). In this example, a "one" is represented by 5 volts, and a "zero" is represented by 0 volts. Modulators 220a-220n modulate the output from laser sources 218a-218n to be optically "off" when the modulation signal is a "zero" and optically "on" when the modulation signal is a "one."

A wavelength division multiplex system (a WDM system) is frequently used to achieve a high capacity network, but when initially installed, only one or a few of the wavelength division channels are used to transmit information signals. Further, at times one or more of the wavelength division channels may not transmit correctly or the information signal transmitters may be disabled. In such instances, node 200 provides a source signal that combines information signals from the transmitters 210a-210n and filtered noise signals from the backup transmitters 208a-208n. The information signals come from one or more transmitters 210a-210n on utilized wavelength channels of node 200. At the same time, the filtered noise signals come from ASE light source 212a-212n through optical filters 214a-214n of the backup transmitters 208a-208n. The optical filters 214a-214n may be tunable filters, e.g., the filters 214a-214n, may be tuned and/or tunable to correspond to the wavelengths of information signals from transmitters 210a-210n matched with the optical filters 214a-214n in each transmitter system 206a-206n so noise is not added to information signals from other transmitters.

When it is desired to add more information signals, appropriate transmitters 210a-210n may be activated and switches 230a-230n switch the signal being transmitted through output optical cables 204a-204n from the noise signals from the backup transmitters 208a-208n to the information signal transmitted from the transmitters 210a-210n. In this way, noise is not added to the desired information signals and all WDM channels are loaded.

When a disabled channel is ready to transmit an information signal again (i.e., when a damaged transmitter has been fixed), transmitter 210a-210n begins to transmit an information signal and switch 230a-230n changes the signal being sent through output optical cables 204a-204n from the noise transmitted by the backup transmitter 208a-208n to the information signal transmitted by the transmitter 210a-210n.

To determine which WDM channels are currently being utilized and transmitting correctly, node 200 is provided with control circuit 236 connected to optical fiber link 203 via a tap 232 and a photo diode 234. Control circuit 236 sends signals to switches 230a-230n over connections 238a-238n that determine which signal (information signals from the transmitters 210a-210n or noise signals from the backup transmitters 208a-208n) is sent through output optical cables 204a-204n to the multiplexer 202. For instance, control circuit may assess the signal transmitted through the optical fiber link 203 and determine that an expected information signal is not being transmitted correctly (i.e., an expected signal is not present or power has changed by more than a threshold amount, for example). This can be accomplished by comparing the current optical spectrum to a baseline optical spectrum. In such a case, the control circuit may send a signal to the appropriate switch 230a-230n associated with the expected information signal to switch the output signal from the transmitter 210a-210n to the backup transmitter 208a-208n so that noise is transmitted in the appropriate spectrum while the problem is assessed and the wavelength fault can be rectified. When the problem is fixed (e.g., a damaged transmitter is fixed or replaced), the control circuit 236 sends a signal to the appropriate switch 230a-230n to switch the output signal from the noise signal transmitted by the backup transmitter 208a-208n to the information signal transmitted by the transmitter 210a-210n. In this way, control circuit 236 ensures that node 200 loads all WDM channels, even if some of the channels are loaded with noise.

While each transmitter system 206a-206n of node 200 has been shown having an ASE light source 212a-212n, it should be noted that in another embodiment a single ASE light source (not shown) optically connected to filters 214a-214n may be provided at node 200 that emits light across the desired spectrum (e.g., the C-Band). In such an embodiment, optical filters 214a-214n take the full spectrum transmission and filter the spectrum to match the spectrum that would be transmitted by the transmitter 210a-210n associated with the optical filter 214a-214n.

One or more amplifiers (not shown) may also be provided to boost the intensity of optical signals from the one ASE light source 212a-n before the optical signal reaches optical filters 214a-214n. The one or more amplifiers may be of any type known in the industry such as erbium-doped fiber amplifiers, for instance.

Figure 9:
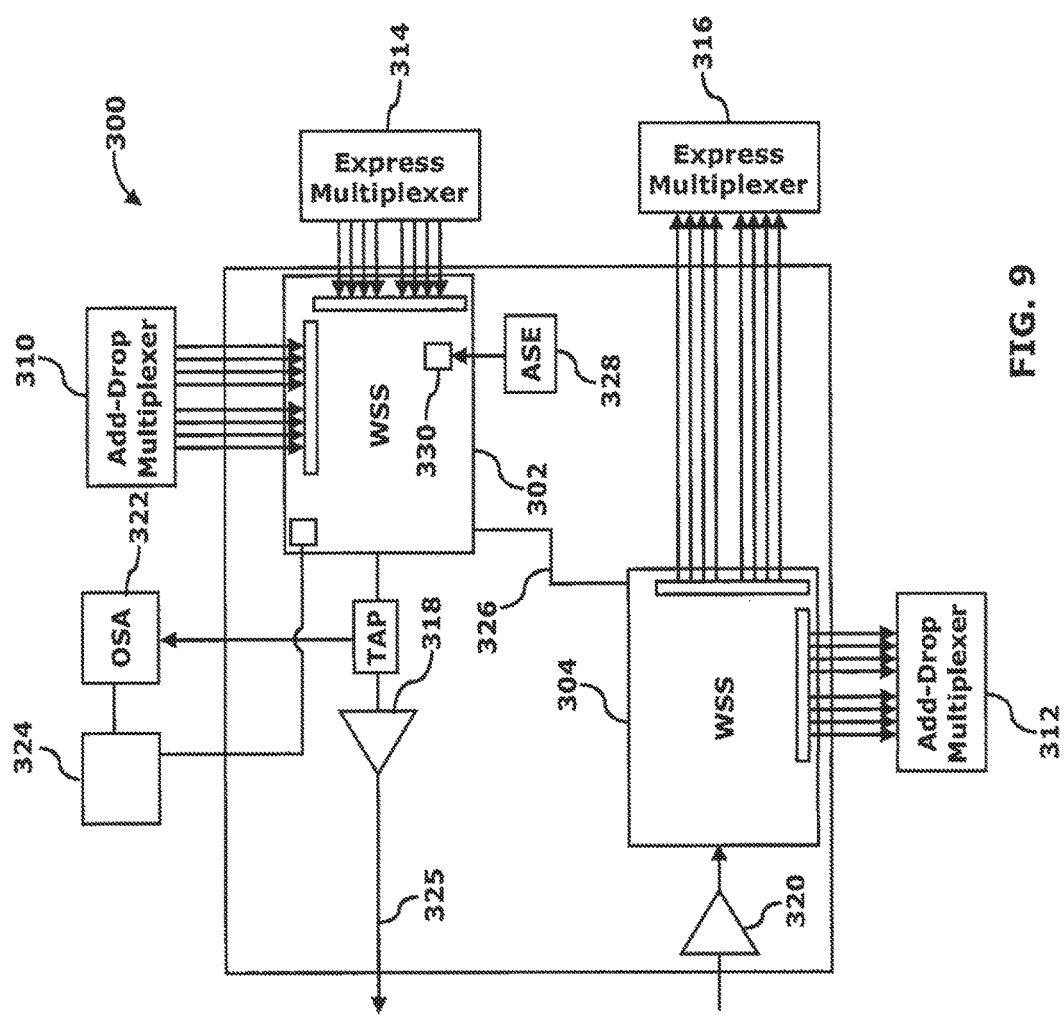
FIG. 9 is a schematic diagram of a physical layer of one embodiment of an optical interface of a node constructed in accordance with the present disclosure that loads spectral band not used for communicating data with idler channels providing optical signal power at specific wavelengths without imposition of data.

In another embodiment illustrated in FIG. 9, a node 300 may be provided having a first wavelength selective switch 302 and a second wavelength selective switch 304. The first wavelength selective switch 302 and the second wavelength selective switch 304 are substantially the same as wavelength selective switch 114 described above. Therefore, in the interest of brevity, only the differences between first and second wavelength selective switches 302 and 304 and wavelength selective switch 114 will be described in detail herein.

First and second wavelength selective switches 302 and 304 may be configured to accept input signals from optical add-drop multiplexers 310 and 312, respectively, and/or express multiplexers 314 and 316, respectively. First and second wavelength selective switches 302 and 304 may be connected via communication path 326 which allows two-way communication between the first and second wavelength selective switches. As will be recognized by a person of skill in the art, first and second wavelength selective switches 302 and 304 allow the node 300 to operate in the C-Band and Extended C-Band (4.8 Thz).

Node 300 may also be provided with amplifier 318 to boost the transmitted signal and amplifier 320 to boost the received signal. Amplifiers 318 and 320 may be any amplifier known in the art. It should be noted, however, that in another embodiment node 300 may be provided without amplifiers 318 and 320 where in-line amplifiers exist.

Node 300 may also be provided with an optical spectrum analyzer 322 and a controller 324 configured to permit dynamic shaping of the optical signal output by the node 300. The optical spectrum analyzer 322 reads an optical spectrum of the optical signals being provided to an optical fiber link 325 by the node 300 via a tap and one or more photodetector(s). For example, the optical spectrum analyzer 322 may be provided with circuitry, e.g., one or more photodetectors that convert the optical signals received from the tap into a format in which the optical spectrum analyzer 322 can read the optical spectrum of the optical signals from the first wavelength selective switch 302. In one embodiment, the optical spectrum analyzer 322 reads a first optical signal spectrum to obtain a baseline profile of optical power corresponding to frequency (or wavelength) being supplied to the optical fiber by the node 300. The readings of the optical spectrum analyzer 322 can be supplied as electrical signals to the controller 324, which uses the readings to add/remove an idler carrier depending upon desired and/or unexpected additions/removals of optical carriers. The idler carrier is supplied by ASE light source 328 connected to the first wavelength selective switch 302 via input port 330.

Figure 10:
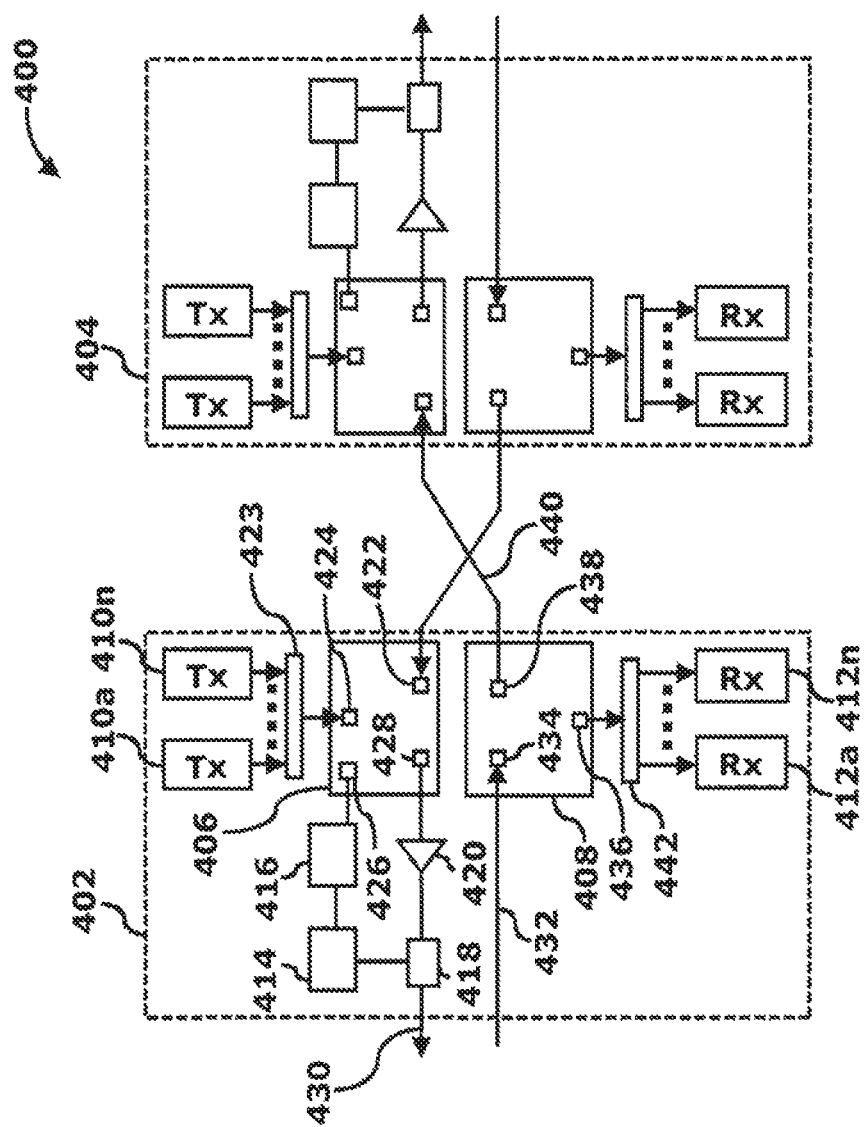
FIG. 10 is a schematic diagram of a physical layer of a multi-degree wavelength selection switch node constructed in accordance with one embodiment of the inventive concepts disclosed herein.

FIG. 10 illustrates one embodiment of a multi-degree wavelength selection switch 400 having a first node 402 and a second node 404. While FIG. 10 illustrates a two-degree switch, a person of skill in the art having the benefit of the present disclosure would understand that the inventive concepts illustrated and described herein apply equally to switches having more than two degrees. First node 402 and second node 404 are substantially the same in construction and function. Therefore, in the interest of brevity, only the features of the first node 402 are labeled and described herein.

The first node 402 may be provided with a wavelength selection switch 406, a optical splitter 408, transmitters 410a-410n, receivers 412a-412n, an optical spectrum analyzer 414, a controller 416, a tap 418, and an amplifier 420.

The wavelength selection switch 406 of the first node 402 is provided with a plurality of input ports 422 and 424, a digital input port 426, an optical output 428, and an output optical cable 430.

An input optical cable 432 is connected to an optical input port 434 of the power splitter 408. The optical splitter 408 is further provided with optical output ports 436 and 438.

In the illustrated embodiment, optical splitter 408 splits the optical signal transmitted over the input optical cable 432 into a first part and a second part. The optical splitter 408 outputs the first part of the optical signal via optical output port 438 over optical line 440 which connects to an optical input port (not designated) of the wavelength selection switch (not designated) of the second node 404. The second part of the optical signal is sent to a demultiplexer 442 via optical output port 436. Demultiplexer 442 transmits terminal signals to receivers 412a-412n.

The wavelength selection switch 406 of the first node 402 receives a first part of an optical signal from an optical splitter (not designated) of the second node 404. The wavelength selection switch 406 combines the first part of the optical signal with optical signals received from transmitters 410a-410n through multiplexer 423 and transmits a combined optical signal via output optical cable 430. The combined optical signal may be boosted by amplifier 420 before reaching tap 418. The optical spectrum analyzer 414 reads an optical spectrum of the combined optical signal being provided to the optical cable 430 by the first node 402 via tap 418. As described above, optical spectrum analyzer 414 reads the optical spectrum of the combined optical signals from the wavelength selective switch 406 to obtain a baseline profile of optical power corresponding to frequency (or wavelength) being supplied to the optical cable 430 by the first node 402. The readings of the optical spectrum analyzer 414 can be supplied as electrical signals to the controller 416, which uses the readings to add/remove an idler carrier depending upon desired and/or unexpected additions/removals of optical carriers as described above. For instance, one or more of the transmitters 410a-410n may be an ASE light source as described herein which provides optical input that may be added as noise.

Figure 11:
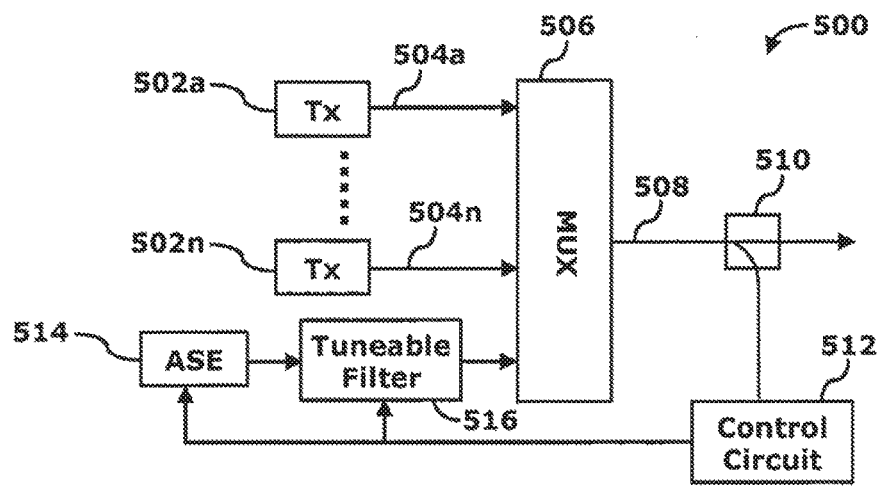
FIG. 11 is a schematic diagram of a physical layer of an optical interface of a node constructed in accordance with another embodiment of the present disclosure.

FIG. 11 shows a physical layer of a node 500, which may be a terminal node consistent with the present disclosure. The node 500 is configured to insert optical carriers, for example, modulated optical signals, each having a different wavelength onto an optical fiber link 508, such as a subsea line system or a terrestrial line system via Dynamic Spectral Sharing (DSS), i.e., loading at least one portion of the optical spectrum with an idler carrier to compensate for lack of an optical carrier carrying data. As described in greater detail below, loading the optical signal spectrum with idler carriers that may be generated using an amplified stimulated emission (ASE) light source 514, consistent with the present disclosure, may be provided to protect traffic in the event of failure of one or more transmitters 502a-502n supplying optical carriers within the dynamically shared spectra, for example.

The transmitters 502a-502n transmit an optical carrier signal to a multiplexer 506 across lines 504a-504n. The multiplexer 506 can be a wavelength division multiplexer that combines optical carrier signals generated by the transmitters 502a-502n onto a single waveguide that is inserted onto optical fiber link 508. The modulated optical signals or optical carriers may further be provided having an admin signal or low frequency tone included that is unique to each optical carrier for identification and monitoring purposes. Techniques for adding and interpreting a low frequency tone are described in U.S. Pat. Nos. 7,697,580 and 7,881,612, for example, the entire content of which is hereby incorporated herein by reference.

Control circuit 512 reads an optical spectrum of the modulated optical signals or optical carriers being provided on the optical fiber link 508 by the node 500 via tap 510. For example, the control circuit 512 may read a first optical signal spectrum to obtain a baseline profile of optical power corresponding to frequency (or wavelength) being supplied to the optical fiber link 508 by the node 500. Subsequent readings of optical signal spectrum by the control circuit 512 may be used to add/remove an idler carrier depending upon desired and/or unexpected additions/removals of optical carriers as compared to the baseline reading.

The control circuit 512 monitors the output of the multiplexer 506 via the tap 510. When the control circuit 512 determines that an optical channel that should be transmitting is not, the control circuit 512 is programmed to cause an ASE light source 514 to generate an idler carrier signal that is transmitted to a tunable filter 516. Control circuit 512 causes the tunable filter 516 to shape the idler carrier signal to fill/replace optical carrier channels that are either not in use or are not being transmitted because a transmitter has failed, for instance. In this way, the node 500 ensures that the optical signal spectrum being transmitted on the optical fiber link 508 is loaded.

When a failed transmitter has been fixed and should be reinstated, the node 500 may be configured to receive a signal from a user via the GUI or CLI (as described above with reference to FIG. 4) that causes the control circuit 512 to replace the idler carrier signal with the optical carrier signal containing data. In another embodiment, the node 500 may be configured to automatically switch from the idler carrier signal to the optical data carrier signal upon restoration of the failed transmitter. This can be accomplished in a similar manner as described above with respect to FIG. 4, with the exception that the control circuit 512 may determine that the optical carrier signal has been replaced because the tone associated with that channel is once again being transmitted. In either case, the control circuit 512 may be programmed to gracefully switch from transmitting the idler carrier signal to the optical carrier signal upon restoration of the transmitter by sending control signals to the tunable filter 516 to prevent the certain wavelengths of the idler carrier signal from being introduced to the multiplexer 506, and/or sending control signals to the ASE light source 514 to turn the ASE light source 514 off.

Figure 12:
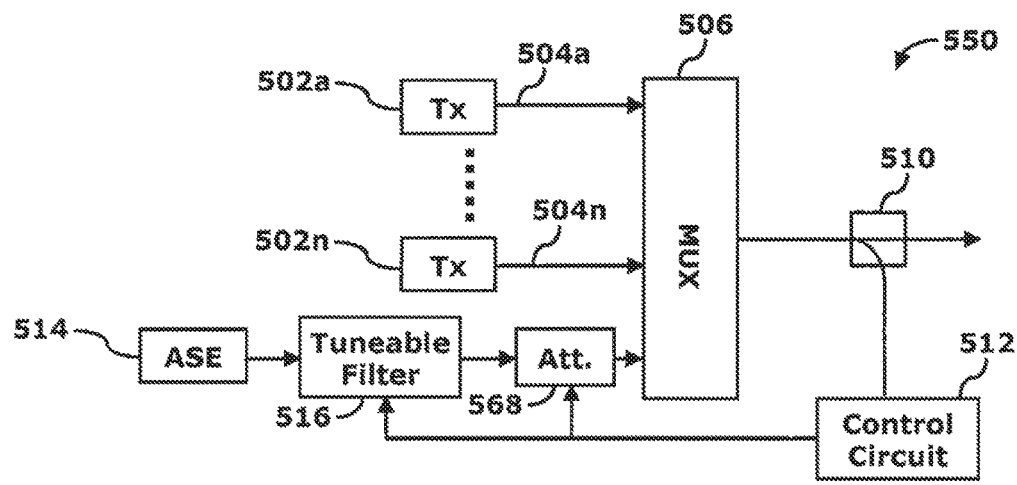
FIG. 12 is a schematic diagram of a physical layer of an optical interface of the node constructed in accordance with yet another embodiment of the present disclosure.

Shown in FIG. 12 is another embodiment of a node 550 that is constructed in accordance with the present disclosure. The node 550 is similar to the node 500 described above with respect to FIG. 11, with the following exceptions. In the embodiment depicted in FIG. 12, the node 550 is provided with an optical attenuator 568 coupled to an output of the tunable filter 516. The optical attenuator 568 is configured to selectively attenuate optical signals provided by the tunable filter 516 to in effect mimic the ASE light source 514 being turned on and off. In this embodiment, the ASE light source 514 may be configured to continuously generate an idler carrier signal that is transmitted to the tunable filter 516 and the control circuit 512 may be programmed to cause the optical attenuator 568 to alternatively couple a shaped idler carrier signal output by the tunable filter 566 with the multiplexer 556 when the idler carrier signal is needed and de-couple the idler carrier signal when the idler carrier signal is not needed. For instance, the optical attenuator 568 may be a micro-electromechanical system (MEMS) chip as is known in the art and the control circuit 512 may send a voltage to the optical attenuator 568 that causes a mirror to rotate which changes the coupling of the idler carrier signal between input and output fibers of the optical attenuator 568.

Figure 13:
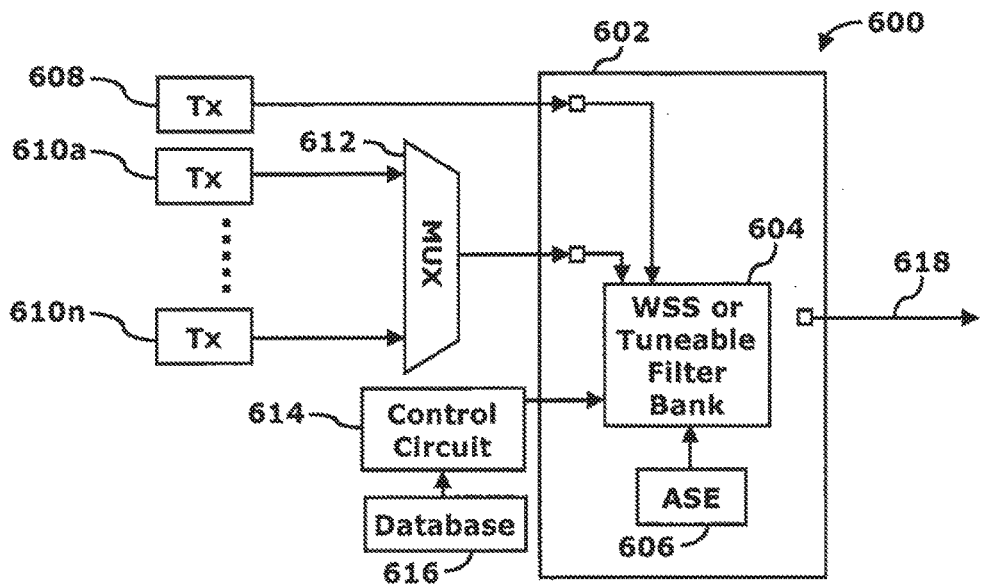
FIG. 13 is a schematic diagram of another embodiment of a physical layer of an optical interface constructed in accordance with the present disclosure.

Shown in FIG. 13 is a physical layer of a node 600 constructed in accordance with the presently disclosed inventive concepts. The node 600 is provided with an optical add drop multiplexer 602 which may be a reconfigurable or a fixed add drop multiplexer. The add drop multiplexer 602 is provided with a wavelength selective switch 604, an ASE light source 606 optically coupled to the wavelength selective switch 604, and a plurality of input and output optical ports (not numbered).

The node 600 is further provided with optical transmitters 608 and 610a-n. Optical transmitters, such as the optical transmitter 608, may connect directly to optical inputs of the optical add drop multiplexer 602. Optical output signals from optical transmitters 610a-610n may also be multiplexed prior to being transmitted to one of the optical inputs of the optical add drop multiplexer 602 as shown. The multiplexer 612 multiplexes the optical signals from optical transmitters 610a-n before transmitting a multiplexed optical signal to the optical add drop multiplexer 602. In either case, the optical signals are routed to the wavelength selective switch 604 and further multiplexed together.

The node 600 is further provided with a control circuit 614 connected to the wavelength selective switch 604 and a database 616. The database 616 stores reservation and/or provision information that informs the control circuit 614 when certain optical channels are or will be filled with an optical carrier signal carrying data. The control circuit 614 is programmed to cause the wavelength selective switch 604 to shape an idler carrier signal from the ASE light source 606 to fill/replace optical carrier channels that are not in use. In this way, the node 600 ensures that the optical signal spectrum being transmitted from the optical add drop multiplexer 602 on an optical fiber link 618 is loaded. The ASE light source 606 can be integrated within the optical add drop multiplexer 602, or may be a separate from the optical add drop multiplexer 602. When the ASE light source 606 is separate from the optical add drop multiplexer 602, and output of the ASE light source 606 can be connected to an optical input of the optical add drop multiplexer 602.

Figure 14:
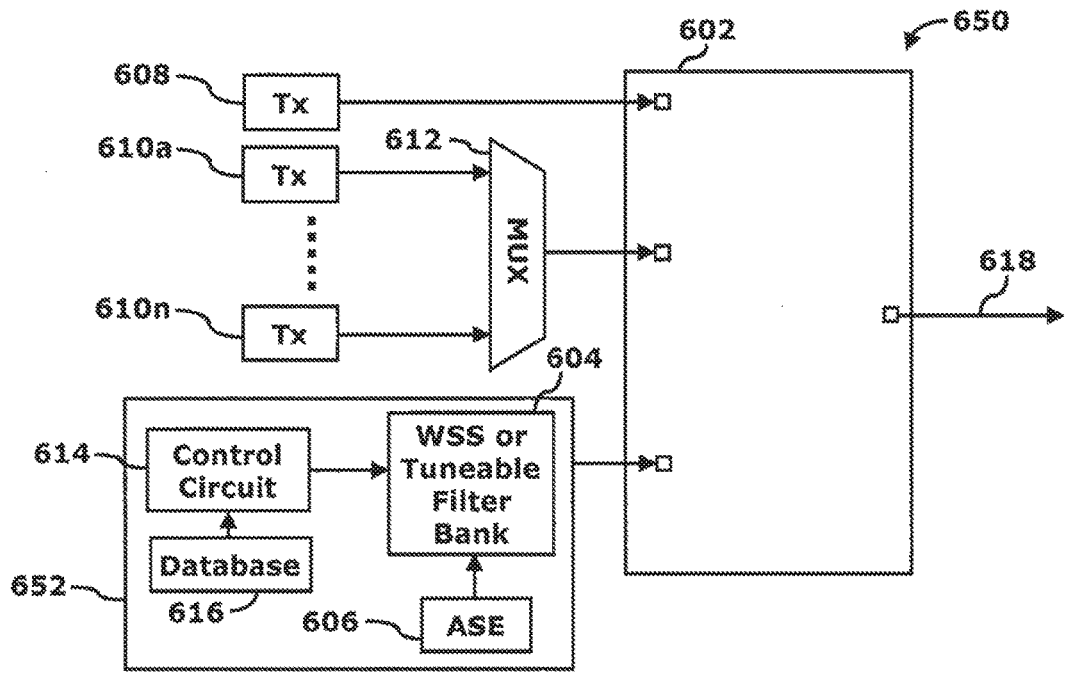
FIG. 14 is a schematic diagram of yet another embodiment of a physical layer of an optical interface constructed in accordance with the present disclosure.

Shown in FIG. 14 is another embodiment of a node 650 that is constructed in accordance with the present disclosure. The node 650 is similar to the node 600 described above with respect to FIG. 13, with the following exceptions. In the embodiment depicted in FIG. 14, the node 650 is provided with a control optical device 652 coupled to an optical input of the optical add drop multiplexer 602. The control optical device 652 is configured to provide shaped idler carrier signals to the optical add drop multiplexer 602 which are then output on the optical fiber link 618. In this embodiment, the wavelength selective switch 604, the ASE light source 606, the control circuit 614, and the database 616 are part of the control optical device 652 with the idler carrier signal created as described above.

Figure 15:
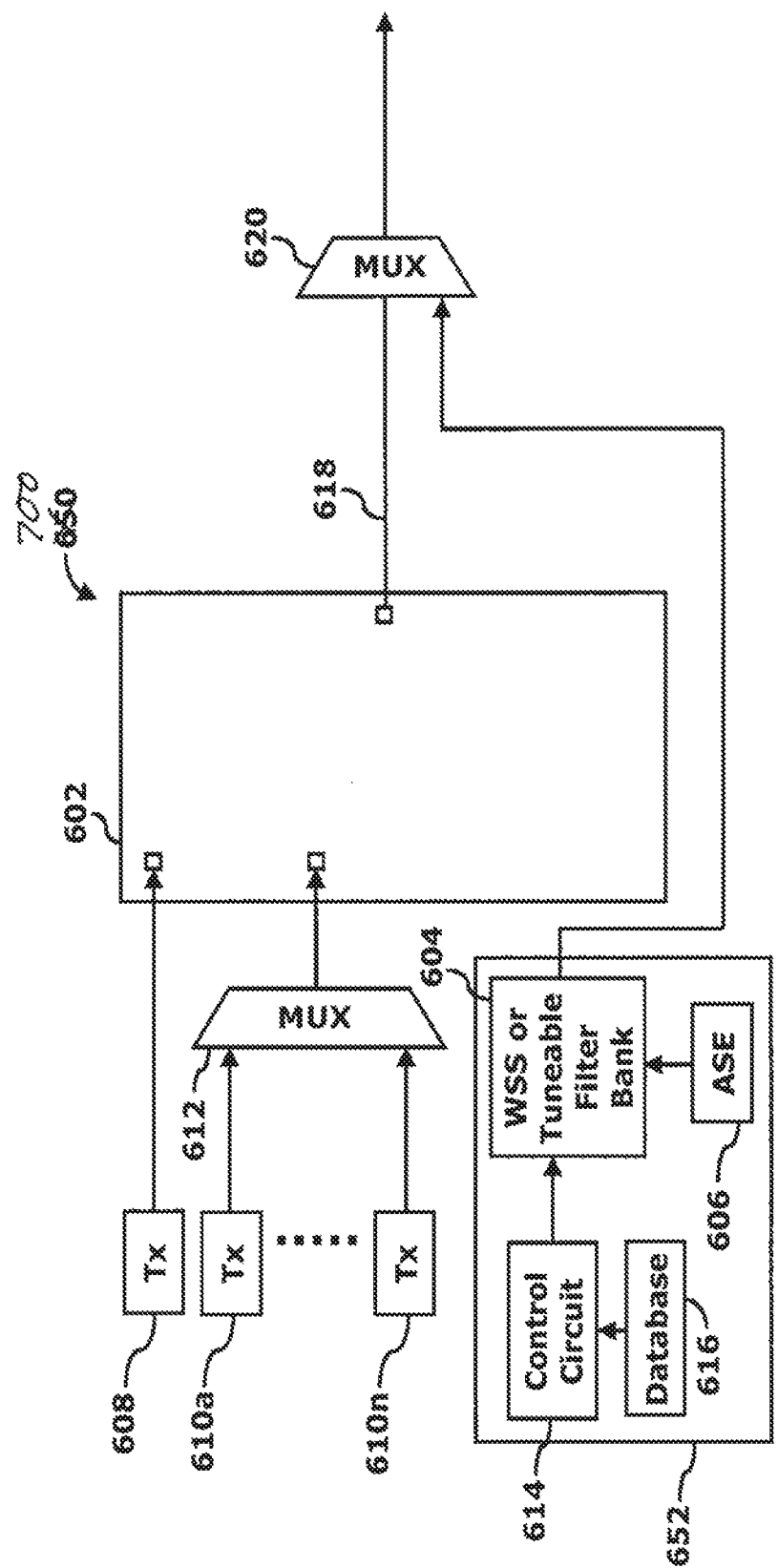
FIG. 15 is a schematic diagram of a further embodiment of a physical layer of an optical interface constructed in accordance with the present disclosure.

Shown in FIG. 15 is another embodiment of a node 700 that is constructed in accordance with the present disclosure. The node 700 is similar to the node 650 described above with respect to FIG. 14, with the following exceptions. The node 700 is provided with a multiplexer 620 optically connected to the optical fiber link 618. In this embodiment, shaped idler carrier signals provided by the wavelength selective switch 604 of the control optical device 652 are provided to the optical multiplexer 620 where they are multiplexed with the optical carrier signals output by the optical add drop multiplexer 602 and output on the optical fiber link 618.

CONCLUSION

The mechanisms proposed in this disclosure circumvent the problems described above. The present disclosure improves upon the optical node by including a switching mechanism that can provide or remove idler carriers into the transmitted optical signal power spectrum. The problem of the rather unpredictable nature of accumulated line spread is addressed with systems and methods for providing a substantially consistent transmitted optical signal power spectrum notwithstanding a loss of one or more optical carriers in the transmitted optical signal power spectrum thereby decreasing the line-spread and improving performance of the optical link. Once the optical link is optimized, subsequent changes will be small since the ASE idler will fill the optical bandwidth. In this manner, the fiber network is operated at or close to max loading/capacity conditions resulting in a reduction in the power and noise changes due to line-spread changes. Maintaining a consistent line spread also decreases the dynamic range needed for hardware design and operating conditions. This way, hardware can be optimized to provide better performance for a narrow dynamic range. Also, the burden for high margins in the optical link design will be alleviated, resulting in better reach and/or signal performance and/or fiber data capacity.

The disclosed inventive concepts are applicable to a single carrier channel, a multiple carrier channel, and a superchannel.

In one embodiment, the present disclosure describes systems and methods in which a loss of spectrum in the optical signal is detected, and at least one idler carrier without data imposed thereon is loaded into the optical signal to replace the lost spectrum, thereby providing optical signal power within the lost spectral band that does not have data imposed thereon. This permits changes in the loading conditions of the optical fiber, without substantially affecting the accumulated line spread.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Also, certain portions of the implementations may have been described as "components" or "circuitry" that perform one or more functions. The term "component" or "circuitry" may include hardware, such as a processor, an application specific integrated circuit (ASIC), a tap, a photodetector, or a field programmable gate array (FPGA), or a combination of hardware and software.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A method comprising the steps of:
    detecting a loss of spectrum in an optical signal having an optical signal spectrum, the optical signal being transmitted from a first node to a second node;
    in response to detecting the loss of spectrum in the optical signal, supplying at least one idler carrier without data imposed into the optical signal spectrum transmitted from the first node to the second node, the optical signal spectrum encompassing a frequency band including a plurality of optical channels, the idler carrier being amplified stimulated emission light having a frequency corresponding to a first optical channel of the plurality of optical channels,
    wherein supplying at least one idler carrier is defined further as forming the idler carrier by generating amplified stimulated emission light devoid of data and having a spectrum encompassing a first optical channel and a second optical channel of the plurality of optical channels; and passing the amplified stimulated emission light through a wavelength selective switch to pass a first portion of the amplified stimulated emission light corresponding to the first optical channel and drop a second portion of the amplified stimulated emission light corresponding to the second optical channel.

2. The method of claim 1, wherein the optical signal spectrum is in a range from 1530 nm to 1565 nm.

3. The method of claim 1, further comprising the step of generating an optical carrier having data imposed thereon and having a wavelength corresponding to the second channel, and multiplexing the optical carrier having data imposed thereon with the idler carrier.

4. The method of claim 3, wherein multiplexing the optical carrier having data imposed thereon with the idler carrier is defined further as passing the optical carrier and the idler carrier through the wavelength selective switch.

5. A method comprising the steps of:
    detecting a loss of spectrum in an optical signal having an optical signal spectrum, the optical signal being transmitted from a first node to a second node;
    in response to detecting the loss of spectrum in the optical signal, supplying at least one idler carrier without data imposed into the optical signal spectrum transmitted from the first node to the second node, the optical signal spectrum encompassing a frequency band including a plurality of optical channels, the idler carrier being amplified stimulated emission light having a frequency corresponding to a first optical channel of the plurality of optical channels, wherein supplying at least one idler carrier without data imposed into the optical signal spectrum transmitted from the first node to the second node, is defined further as receiving, by an optical switch, first light having a frequency corresponding to the first optical channel with data encoded into the first light, and second light having a frequency corresponding to the first optical channel without data encoded into the second light, and switching the optical switch from passing the first light to passing the second light thereby supplying at least one idler carrier without data imposed into the optical signal spectrum.

6. The method of claim 5, further comprising passing amplified stimulated emission light from an amplified stimulated emission light source through a tunable filter tuned to a frequency corresponding to the first optical channel to generate the second light.

7. The method of claim 1, further comprising multiplexing first light having a first carrier frequency corresponding to a first optical channel with second light having a second carrier frequency corresponding to a second optical channel to generate the optical signal having the optical signal spectrum, the first light having first data encoded into the first carrier frequency.

8. A method, comprising:
    transmitting a first optical signal from a first node to a second node, the first optical signal having a first optical signal spectrum with first optical carriers encoded with data and corresponding to a first group of optical channels being present within the first optical signal, and first optical idlers being shaped amplified stimulated emission light devoid of data and corresponding to a second group of optical channels being present within the first optical signal;
    analyzing the first optical signal spectrum to obtain a baseline of optical power corresponding to frequency; and
    generating a second optical signal having second optical carriers encoded with data and corresponding to a third group of optical channels being present within the second optical signal, and second optical idlers being shaped amplified stimulated emission light devoid of data and corresponding to a fourth group of optical channels being present within the second optical signal such that the second optical signal has a second optical signal spectrum that substantially matches the baseline, wherein generating the second optical signal is defined further as monitoring changes to the first optical carriers with an optical spectrum analyzer reading the first optical signal; and modifying the first optical idlers to be the second optical idlers with a wavelength selective switch based upon a reading of the optical spectrum analyzer, the first and second optical idlers being generated with amplified stimulated emission light fed into the wavelength selective switch.

9. The method of claim 8, wherein the first optical carriers are different from the second optical carriers, and the first optical idlers are different from the second optical idlers.

10. The method of claim 8, wherein the first optical signal spectrum is in a range from 1530 nm to 1565 nm.

11. A node, comprising:
   a first transceiver configured to generate a first optical carrier with encoded first data, the first optical carrier corresponding to a first optical channel;
   a second transceiver configured to generate a second optical carrier with encoded second data, the second optical carrier corresponding to a second optical channel;
   an amplified stimulated emission light source generating amplified stimulated emission light encompassing both the first optical channel and the second optical channel;
   a wavelength selective switch having input ports to receive light from the first transceiver, the second transceiver and the amplified stimulated emission light light source, the wavelength selective switch receiving an input indicative of a desired output spectrum, and shaping and multiplexing at least two of the first optical carrier, the second optical carrier and the amplified stimulated emission light to generate an output optical signal;
   an optical spectrum analyzer receiving light from the output optical signal, analyzing the light, and generating signals indicative of an optical spectrum of the light; and
   a controller receiving the signals indicative of an optical spectrum of the light, and controlling the wavelength selective switch to maintain a substantially stable optical spectrum in the output optical signal.

12. The node of claim 11, further comprising a tunable filter receiving the amplified stimulation emission light, filtering the amplified stimulation emission light and supplying the amplified stimulated emission light to the input port of the wavelength selective switch.

13. The node of claim 12, wherein the controller controls the tunable filter to pass amplified stimulated emission light having a frequency corresponding to the first optical channel to the input port of the wavelength selective switch.

14. The node of claim 12, wherein the controller enables the amplified stimulated emission light source to generate the amplified stimulated emission light.

15. The node of claim 12, further comprising an optical attenuator interposed between the tunable filter and the input port of the wavelength selective switch, and wherein the controller switches the optical attenuator from a first state in which amplified stimulation emission light supplied to the optical attenuator is passed to the input port of the wavelength selective switch, and a second state in which amplified stimulation emission light supplied to the optical attenuator is not passed to the input port of the wavelength selective switch.

16. The node of claim 11, wherein the controller stores a baseline of the optical spectrum of the light, compares the signals indicative of the optical spectrum of light to the baseline and controls the wavelength selective switch to maintain the optical spectrum of the output optical signal substantially corresponding to the baseline.

17. A method, comprising:
   transmitting a first optical signal from a first node to a second node, the first optical signal having a first optical signal spectrum with first optical carriers encoded with data and corresponding to a first group of optical channels being present within the first optical signal, and first optical idlers being shaped amplified stimulated emission light devoid of data and corresponding to a second group of optical channels being present within the first optical signal;
   analyzing the first optical signal spectrum to obtain a baseline of optical power corresponding to frequency; and
   generating a second optical signal having second optical carriers encoded with data and corresponding to a third group of optical channels being present within the second optical signal, and second optical idlers being shaped amplified stimulated emission light devoid of data and corresponding to a fourth group of optical channels being present within the second optical signal such that the second optical signal has a second optical signal spectrum that substantially matches the baseline, wherein the first optical signal spectrum and the second optical signal spectrum are equal to at least 75% of a total wavelength spectrum available on a broadcast band in which the first optical signal spectrum and the second optical signal spectrum are transmitted.

* * * * *